(12) United States Patent
Klemmer (10) Patent No.: US 6,353,364 B1
(45) Date of Patent: Mar. 5, 2002

(54) DIGITALLY GAIN CONTROLLABLE AMPLIFIERS WITH ANALOG GAIN CONTROL INPUT, ON-CHIP DECODER AND PROGRAMMABLE GAIN DISTRIBUTION

(75) Inventor: Nikolaus Klemmer, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/218,389

(22) Filed: Dec. 22, 1998

(51) Int. Cl.[7] .............................. H03G 3/10; H04B 7/00
(52) U.S. Cl. ..................... 330/279; 330/282; 330/129; 455/241.1
(58) Field of Search ................................ 330/129, 133, 330/134, 136, 229, 282, 284; 455/241.1, 245.1, 245.2, 251.1, 253.2

(56) References Cited

U.S. PATENT DOCUMENTS

| | | | |
|---|---|---|---|
| 4,704,584 A | * 11/1987 | Smither | 330/282 |
| 4,859,964 A | * 8/1989 | Jorgensen | 330/279 |
| 4,989,074 A | * 1/1991 | Matsumoto | 358/21 R |
| 5,371,473 A | * 12/1994 | Trinh et al. | 330/129 |
| 5,668,501 A | * 9/1997 | Venes | 330/282 |
| 5,724,003 A | * 3/1998 | Jensen et al. | 330/279 |
| 5,826,177 A | * 10/1998 | Uno | 330/279 |
| 5,896,064 A | * 4/1999 | Kaku | 330/279 |
| 5,929,706 A | * 7/1999 | Haruta et al. | 330/282 |
| 6,043,712 A | * 3/2000 | Leizerovich et al. | 330/279 |
| 6,052,030 A | * 4/2000 | Garner et al. | 330/282 |
| 6,060,950 A | * 5/2000 | Groe | 330/129 |
| 6,198,349 B1 | * 3/2001 | Kanno et al. | 330/284 |

* cited by examiner

*Primary Examiner*—Robert Pascal
*Assistant Examiner*—Khanh Van Nguyen
(74) *Attorney, Agent, or Firm*—Coats & Bennett, P.L.L.C.

(57) ABSTRACT

A digital gain controlled VGA is provided having a built-in decoder allowing for more standardized design of radio receivers by allowing a standardized gain control signal to be sent to the digital gain controlled VGA for controlling gain of the digital gain controlled VGA. Additionally, a digital gain controlled VGA is provided which is able to be controlled using an analog gain control signal. Use of the analog gain control signal allows the problems associated with the fast update rate required by the digital gain control word to be overcome. In addition, a digital gain controlled VGA is provided having a programmable decoder and noise and linearity circuit for changing the noise and linearity characteristics of the digital gain controlled VGA during operation.

31 Claims, 7 Drawing Sheets

DIGITALLY GAIN CONTROLLABLE AMPLIFIERS WITH ANALOG GAIN CONTROL INPUT, ON-CHIP DECODER AND PROGRAMMABLE GAIN DISTRIBUTION

FIELD OF THE INVENTION

This invention relates to digitally gain controllable amplifiers, and more particularly, a digitally gain controllable amplifier controllable by an analog gain control signal, and having an on-chip decoder and programmable gain distribution.

BACKGROUND OF THE INVENTION

In a typical "homodyne" receiver, a variable gain amplifier (VGA) may be used to maintain a constant signal amplitude to a load independent of the input signal amplitude. This variable gain amplifier may be implemented with either an analog variable gain amplifier, or a digital variable gain amplifier.

Using an analog variable gain amplifier has many disadvantages such as the requirement of complicated circuitry for maintaining a linear-in-dB gain control characteristic, as well as large chip area requirements for the temperature compensation and predistortion circuit that is used to control the analog variable gain amplifier. Furthermore, the predistortion and temperature compensation circuits consume a significant amount of supply current. Additionally, the analog gain controlled VGAs are noisy as the signal-to-noise ratio at the output of the amplifier depends on the gain setting. Further, analog gain controlled amplifiers essentially constitute amplitude modulators as the gain of the variable gain amplifier could vary as the instantaneous noise voltage overlaying the voltage control signal varies.

Because the digital gain controlled VGAs overcome many of the disadvantages of the analog gain controlled VGAs, it is desirable to use digital gain controlled VGAs. However, digital gain controlled VGAs have one major disadvantage: a required isolation of greater than 60 dB between the serial digital gain control word inputs and the RF signal input of the digital gain controlled VGA, in order to keep a spur generated at the signal frequency at the same level as the noise floor. This attenuation requirement is difficult to achieve when taking into account the parasitic effects that occur within the chip's package and on the board that the chip is attached to.

Additionally, in a digital gain controlled VGA, the digital gain control word sent to the digital VGA must be in a specific format for use by the amplifiers present in the digital VGA. This generally requires that the digital gain controlled VGA be used only in conjunction with specific supporting external circuitry.

Further, while designing a radio receiver utilizing a typical digital gain controlled VGA having multiple amplifying circuits, the operating conditions for the receiver must be predicted in advance in order to set the gain distribution of the multiple amplifier circuits to achieve optimal noise and linearity performance. However, because the operating conditions for the radio receiver are constantly changing, this gain distribution does not yield optimal noise and distortion performance for the majority of the time that the receiver is operating.

The present invention is directed to overcoming one or more of the problems discussed above in a novel and simple manner.

SUMMARY OF THE INVENTION

In accordance with the invention, there is disclosed a digitally gain controllable amplifier controllable by an analog gain control signal. There is further disclosed a digitally gain controllable amplifier having an on-chip decoder. Additionally, there is disclosed a digitally gain controllable amplifier having a programmable gain distribution.

It is an object of the invention to provide a method of controlling a digital variable gain amplifier (DVGA) of a receiver where the DVGA includes an amplifier circuit, the method including the steps of receiving an analog gain control signal indicating a desired gain for the DVGA, and converting the analog gain control signal to a digital gain control signal. The method further includes applying the digital gain control signal to the amplifier circuit to achieve the desired gain, where the amplifier circuit has a gain controlled by the digital gain control signal.

It is a feature of the invention that the DVGA includes a plurality of amplifier circuits, and the method includes decoding the digital gain control signal into a plurality of gain settings, where each gain setting corresponds to one of the plurality of amplifier circuits. The method then includes applying each gain setting to a corresponding amplifier circuit in the DVGA to achieve the desired gain. It is an additional feature of the invention that the digital gain control signal is a final digital gain control signal and an initial digital gain control signal is determined by gain control circuitry, and the initial digital gain control signal is converted to the analog gain control signal. In a further preferred embodiment, the DVGA includes a plurality of amplifier circuits and the method includes controlling the noise and linearity characteristics of the DVGA by changing the distribution of gain across the plurality of amplifier circuits.

It is another object of the invention to provide a method of controlling a DVGA where the DVGA has a plurality of amplifier circuits and the gain of each amplifier circuit is controlled by a gain setting, the method including determining the desired noise and linearity characteristics of the DVGA for a time period. The method also includes increasing the gain setting of a first amplifier circuit, while decreasing gain settings for at least one of a remainder of the plurality of amplifier circuits in the DVGA if an improved/increased noise characteristic is desired for the time period. The method further includes decreasing the gain setting of the first amplifier circuit, while increasing the gain settings for at least one of the remainder of the plurality of amplifier circuits in the DVGA if an increased linearity characteristic is desired for the time period.

It is a feature of the invention that a received signal strength (RSS) is determined for a received signal where the desired noise and linearity characteristic is set for decreased noise if the RSS does not exceed an RSS threshold, and the desired noise and linearity characteristic is set for increased linearity if the RSS exceeds the RSS threshold. It is an additional feature of the invention that the bit error rate (BER) of a detected signal may be used in addition to the RSS where the determined noise and linearity characteristics are maintained if the BER does not exceed a BER threshold, and if the BER exceeds the BER threshold, the desired noise and linearity characteristics are set according to the RSS. It is an additional feature of the invention that an analog gain control signal is received indicating a desired gain for the DVGA, and the analog gain control signal is converted to a digital gain control signal. In a further feature of the invention, a gain control signal is received and encoded into a plurality of gain settings where each gain setting corresponds to one of the plurality of amplifier circuits.

It is an object of the invention to provide a DVGA where the DVGA has an amplifier circuit controlled by a digital gain control signal, the DVGA applying a desired gain to a received signal from a signal source and applying the amplified received signal to the load. The DVGA also includes an analog-to-digital (A/D) converter coupled to the amplifier circuit for receiving an analog gain control signal and converting the analog gain control signal to the digital gain control signal and applying the digital gain control signal to the amplifier circuit.

It is a feature of the invention wherein the DVGA comprises a plurality of amplifier circuits, and further comprises a decoder connected between the A/D converter and the plurality of amplifier circuits for decoding the digital gain control signal into a plurality of gain settings, where each gain setting corresponds to one of the plurality of amplifier circuits. It is another feature of the invention where the digital gain control signal is a final digital gain control signal and a digital-to-analog (D/A) converter external to the DVGA and coupled to the A/D converter receives an initial digital gain control signal from a gain control circuit and converts the initial digital gain control signal to the analog gain control signal. In this case, a common reference voltage may be used for the D/A converter and the A/D converter. Alternatively for this case, a latch may be coupled to the AND converter for latching the final digital gain control signal. The latch and the common reference may be used in conjunction with one another. It is a further feature of the invention that the DVGA comprises a plurality of amplifier circuits and a noise and linearity control (NLC) circuit is coupled to the DVGA for controlling noise and linearity characteristics of the DVGA by changing the distribution of gain across the plurality of amplifier circuits.

It is yet another object of the invention to provide a DVGA with improved noise and linearity characteristics where the DVGA includes a plurality of amplifier circuits, with each amplifier circuit having a gain controlled by a digital gain control signal, and applying a desired gain to a received signal from a signal source, and applying the amplified received signal to a load. The DVGA further includes an NLC circuit comprising a controller coupled to the plurality of amplifier circuits for determining a desired noise and linearity characteristic for the DVGA and including means for increasing a gain setting of a first amplifier circuit and decreasing gain settings for at least one of a remainder of the plurality of amplifier circuits if a decreased noise characteristic is desired, and means for decreasing the gain setting of the first amplifier circuit of the DVGA while increasing the gain settings of at least one of the remainder of the plurality of amplifier circuits if an increased linearity characteristic is desired in the DVGA.

In a feature of the invention, the DVGA includes a decoder for decoding a gain control signal into a plurality of gain settings for the plurality of amplifier circuits using a lookup table, and applies the gain settings to each of the plurality of amplifier circuits to achieve a desired gain, and the controller decreases the noise characteristic and increases the linearity characteristic by changing the values of the gain settings in the lookup table. It is a further feature of the invention that the DVGA further includes an RSS indicator coupled to the DVGA wherein the controller sets the noise and linearity characteristics of the DVGA for decreased noise if it is determined that an RSS does not exceed an RSS threshold, and the controller sets the noise and linearity characteristics of the DVGA for increased linearity if it is determined that the RSS exceeds the RSS threshold. In a further feature of the invention, the DVGA includes a bit error rate detector coupled to the DVGA for determining a bit error rate (BER) for a detected signal wherein the controller maintains the determined noise and linearity characteristics if the BER does not exceed a BER threshold, and if the BER exceeds the BER threshold, the controller sets the desired noise and linearity characteristics using the RSS indicator. In an additional feature of the invention, a lookup table is coupled to the NLC circuit where the lookup table is indexed by a digital gain control signal value and includes gain settings for the plurality of amplifier circuits. In this case, the means for increasing and the means for decreasing gain settings includes the NLC circuit changing the gain settings in the lookup table.

It is another object of the invention to provide a DVGA integrated circuit including at least one amplifier circuit, where each amplifier circuit has a gain controlled by a digital gain control signal and applies a desired gain to a received signal from a single source, and applies the amplified signal to a load. The DVGA further includes a decoder coupled to the at least one amplifier circuit, where the decoder includes a controller for determining a desired gain for the DVGA, and a memory coupled to the controller and having a memory table indexed by a gain control value, where each gain control value has a corresponding gain setting for the at least one amplifier circuit to allow the DVGA to achieve the desired gain. The decoder controller determines the gain control value from a received gain control signal and applies the gain settings corresponding to the gain control value from a memory table to the at least one amplifier circuit to achieve the desired gain.

It is a feature of the invention that the gain control signal of the DVGA integrated fo circuit is an analog gain control signal, and the DVGA includes an A/D converter coupled to the decoder which converts the analog gain control signal to a digital gain control signal, and a decoder controller uses the digital gain control signal to determine a gain control value. It is a further feature of the invention that the DVGA integrated circuit further includes an NLC circuit coupled to the decoder wherein the controller, responsive to the NLC circuit, changes the gain settings in the memory table to control the noise and linearity characteristics of the DVGA.

DETAILED DESCRIPTION OF THE PREFERRED EMBODIMENT

Many of the disadvantages present in a digital gain controlled VGA may be overcome by utilizing an analog gain control signal to control the gain for the digital gain controlled VGA. Additionally, the use of a decoder within the VGA allows greater versatility when designing the receiver as a standardized gain signal may be sent to the digital gain controlled VGA. In addition, the ability to change noise and linearity characteristics of the VGA while the receiver is operating allows for improved reception of signals. For example, if a received signal strength (RSS) is low, noise characteristics may be changed to allow the receiver to better detect the signal. If however, the RSS is high, the linearity characteristics may be improved to allow for less distortion of the received signal.

Generally, the invention disclosed describes a method for the implementation of gain controllable amplifiers that relates to the area of electrical systems and circuit topologies for application specific integrated circuits, herein after referred to generically as integrated circuits. More specifically, the invention disclosed describes a system and method for controlling a digital gain controlled VGA using an analog gain control signal. Thus, many of the disadvantages associated with digital gain controlled VGAs are overcome. The invention disclosed further describes a system and method where a decoder is present within the digital gain controlled VGA integrated circuit (IC) for decoding a gain control signal into gain settings for each amplifier circuit thereby allowing a standardized gain signal to be sent to the digital gain controlled VGA. Additionally, the invention disclosed describes a system and method of changing the noise and linearity characteristics of the digital VGA while the receiver is in operation. Therefore, the receiver is able to tailor the noise and linearity characteristics of the digital gain controlled VGA to the current operating conditions of the receiver.

In one embodiment of the invention, a digital gain controlled VGA IC is provided having a built-in decoder. The presence of the decoder within the digital gain controlled VGA IC allows for a more standardized component for radio receivers. A standardized gain control setting is able to be sent to the digital gain controlled VGA IC with built-in decoder, thereby easing the design complexity of the receivers.

Figure 1:
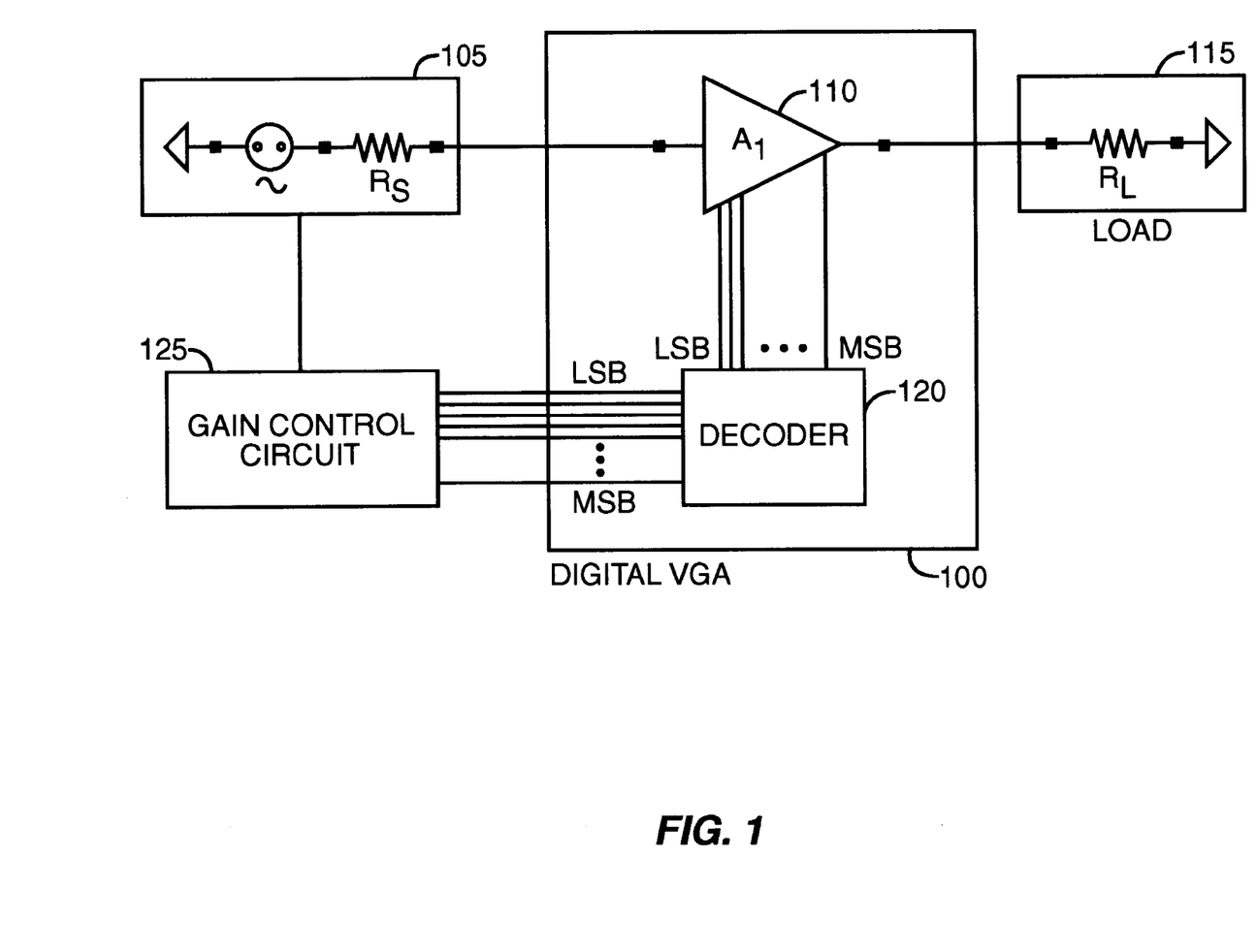
FIG. 1 is a functional block diagram of a digital gain controlled VGA including a decoder in accordance with an embodiment of the invention.

FIG. 1 illustrates a digital VGA 100 utilizing a decoder in accordance with the invention. The digital VGA 100 comprises an amplifier circuit 110 coupled to a decoder 120. A signal source 105 is coupled to the amplifier circuit 110, and the amplifier 110 is further coupled to a load 115. A gain control circuit 125 is coupled to the signal source 105 and to the decoder 120. The signal source 105 may comprise an antenna and an RF filter, for example in a cellular telephone. The amplifier circuit 110 comprises an amplifier controlled by a digital gain control signal as known in the art. The decoder 120 comprises a controller and a lookup table, where the lookup table is indexed by a digital gain control signal value. The lookup table contains a gain setting associated with each digital gain control signal value, where the gain setting is in a format specific to the amplifier circuit 110. The decoder 120 and the amplifier circuit 110 are formed on a single IC.

In operation, a signal is received by the signal source 105. The digital gain control circuit 125 determines a desired gain value for the received signal, and sends the desired gain to the decoder 120 in the form of a digital gain control signal. The controller present in the decoder 120 maps the gain setting represented by the digital gain control signal onto the available gain settings of the amplifier 110. The controller of decoder 120 does this by determining the gain setting from the lookup table, where the gain setting corresponds to the value of the digital gain control signal. This gain setting is then applied by the decoder 120 to the amplifier circuit 110. In this way, the received signal from the signal source 105 is amplified to the desired gain by the amplifier circuit 110, and output to the load 115. The gain setting from the lookup tables may be programmed into the decoder 120 when the chip is manufactured. Alternatively, a suitable controller forms the memory table using algorithms known in the art, for example, during an initialization process each time the digital gain controlled VGA is powered. In a further alternative embodiment, a decoder utilizes a controller to determine gain settings on-the-fly using algorithms known in the art, in which case the lookup table is not present. For the controller to form the memory table or determine gain settings on-the-fly, the controller needs a prior information about the amplifiers present in the digital gain controlled VGA.

Having a digital VGA with built-in decoder allows greater versatility when designing a receiver, as a standardized gain control signal may be sent to the digital gain controlled VGA to achieve the desired gain. Thus, the need for external supporting circuitry specific to the digital gain controlled VGA is eliminated.

In another embodiment of the invention, an analog to digital (A/D) VGA is provided for controlling the digital gain controlled VGA using an analog gain control signal. Use of the analog gain control signal overcomes the problems associated with the large isolation required between the serial digital gain control signal inputs and the RF signal input of the digital gain controlled VGA in order to keep a spur generated at the signal frequency at or below the same level as the noise floor.

Figure 2:
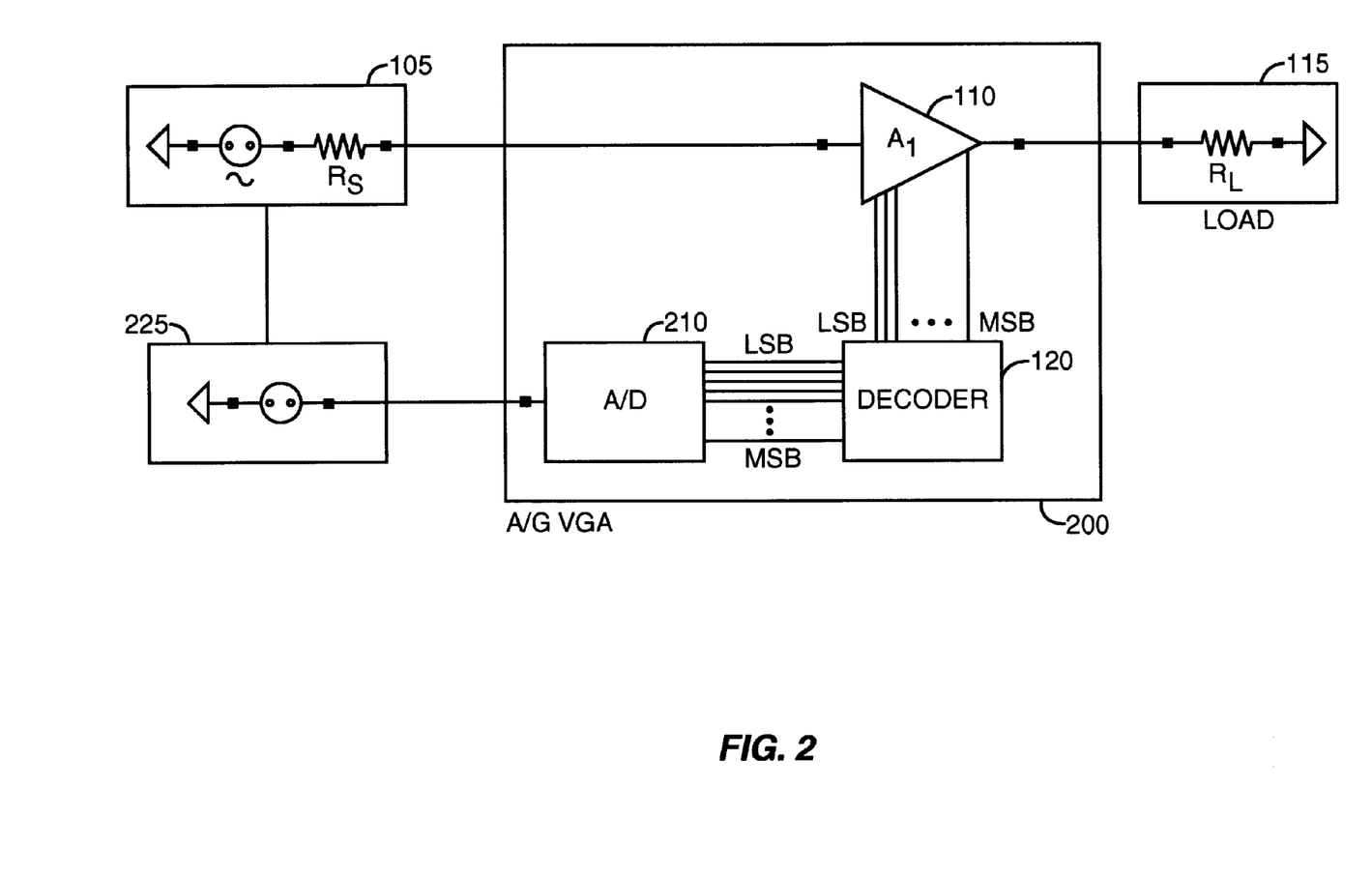
FIG. 2 is a functional block diagram of an A/D VGA in accordance with an embodiment of the invention.

FIG. 2 illustrates an A/D VGA controlled by and analog gain control signal in accordance with an embodiment of the invention. Elements having the same reference numerals as elements in FIG. 1 are the same and will not be discussed in greater detail. The A/D VGA 200 further comprises an A/D converter 210 coupled to the decoder 120. A gain control circuit 225 is coupled to the A/D converter 210 and the signal source 105. The A/D converter 210 is a typical A/D converter as known in the art.

In operation, a signal is received by the signal source 105. The gain control circuit 225 determines a desired gain for the received signal, and sends the desired gain to the A/D converter 210 in the form of an analog gain control signal. The A/D converter 210 then converts the analog gain control signal to a digital gain control signal. The controller present in the decoder 120 maps the gain setting represented by the digital gain control signal onto the available gain settings of the amplifier 110, where the gain setting corresponds to the value of the gain control signal. This gain setting is then applied by the decoder 120 to the amplifier circuit 110. In this way, the received signal from the signal source 105 is amplified to the desired gain by the amplifier circuit 110 and output to the load 115.

Having a digital VGA controlled by an analog gain control signal is advantageous as it avoids necessity of the high data rate digital clock and data inputs associated with the digital gain control signal, thereby eliminating the large isolation requirement between the serial digital gain control word input and the radio frequency (RF) signal output of the digital gain controlled VGA. A/D conversion of the analog gain control signal is performed on-chip. Isolation achievable on chip is significantly higher, well above 90 dB, then where signals are passed through the IC package. This allows the RF signal to be undisturbed by a continuously changing gain for the digital gain controlled VGA. As an alternative, the decoder 120 can be omitted from the A/D VGA 200 while retaining the benefits gained by using the analog gain control signal. In this case, the gain control circuit 225 sends an analog gain control signal to A/D converter 210 in a format specific to the amplifier circuit 110.

In another embodiment of the invention, a digital gain controlled VGA is provided having plural amplifier stages and a built-in decoder. The decoder allows a standardized gain signal to be sent to the digital gain control VGA, where the decoder determines and distributes gain settings to the plural amplifier stages to achieve a desired overall gain.

Figure 3:
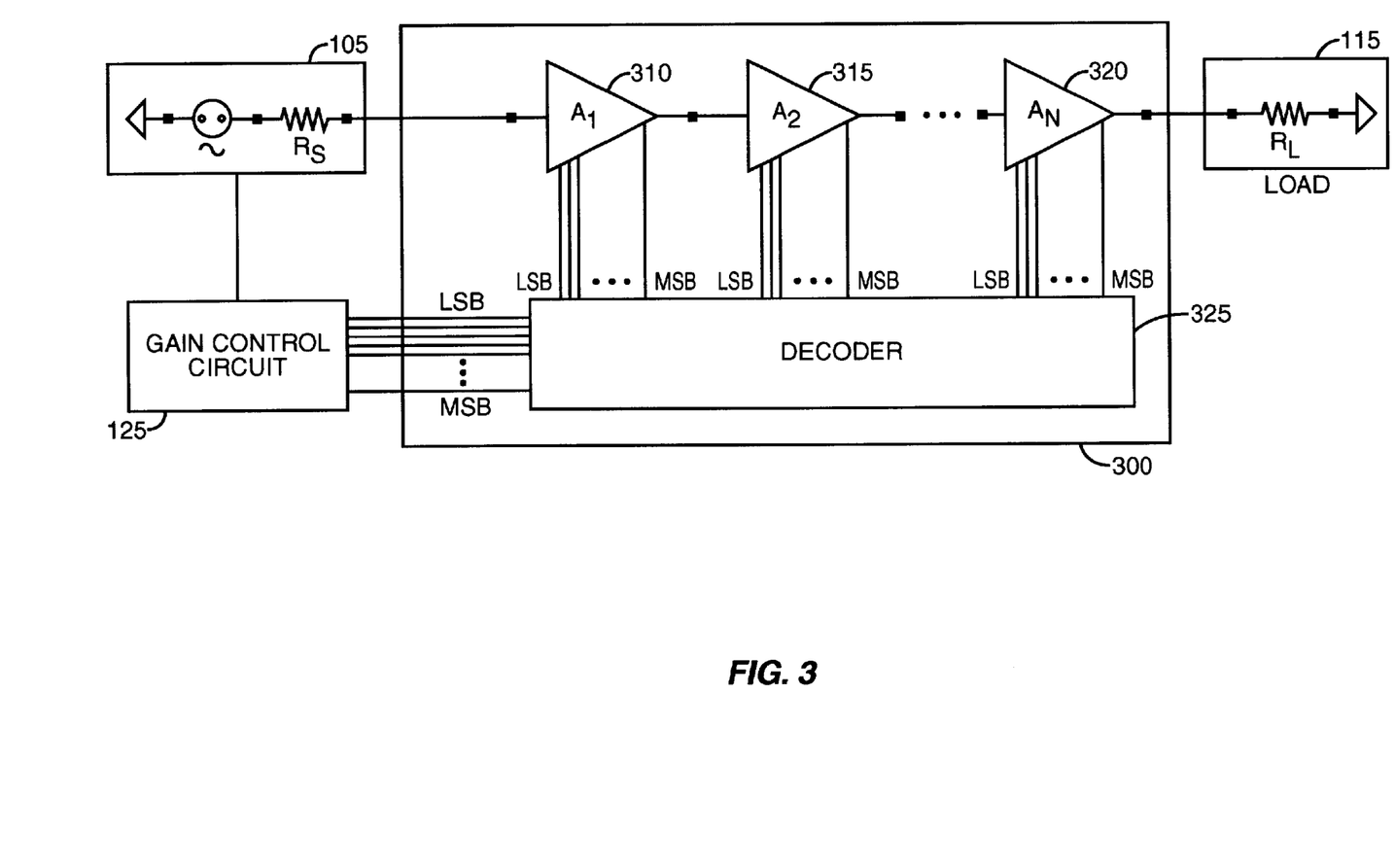
FIG. 3 is a functional block diagram of a digital gain controlled VGA including plural amplifier circuits and a decoder in accordance with an embodiment of the invention.

FIG. 3 illustrates a digital gain controlled VGA having plural amplifier circuits utilizing a decoder in accordance with the invention. Elements having the same reference numerals as elements in FIG. 1 are the same and will not be discussed in greater detail. FIG. 3 shows a digital VGA 300 having an amplifier circuit 310 coupled to an amplifier circuit 315, which is coupled to an amplifier a circuit 320. The Amplifier circuits 310, 315, and 320 are coupled to decoder 325. The signal source 105 is coupled to the amplifier circuit 310, and the amplifier circuit 320 is coupled to the load 115. The gain control circuit 125 is coupled to the signal source 105 and to the decoder 325.

In operation, a signal is received by the signal source 105. The digital gain control circuit 125 determines a desired gain for the received signal, and sends the desired gain to the decoder 325 in the form of a digital gain control signal. The controller present in the decoder 325 maps the gain setting represented by the digital gain control signal onto the available gain settings of the amplifier circuits 310, 315 and 320. The controller does this by determining a gain setting from a lookup table in the decoder, where a gain setting for each of the amplifier circuits 310, 315 and 320 correspond to the value of the gain control signal. The gain settings from the lookup table are then applied by the decoder 325 to the corresponding amplifier circuits 310, 315 and 320. In this way, the received signal from the signal source 105 is amplified to the desired gain by the amplifier circuits 310, 315 and 320 and applied to the load 115. As mentioned in regard to FIG. 1, having a digital VGA with built-in decoder allows greater versatility when designing a receiver, as the decoder allows a standardized gain control signal to be sent to the digital VGA to achieve the desired gain. The gain settings to be applied to the amplifier circuits 310, 315 and 320 are calculated using algorithms as known and the art. Formation of the lookup table may occur as described in relation to FIG. 1 and will not be discussed in detail here.

In a further embodiment of the invention, an A/D VGA is provided having plural amplifying stages, for controlling the digital gain control VGA using an analog gain control signal.

Figure 4:
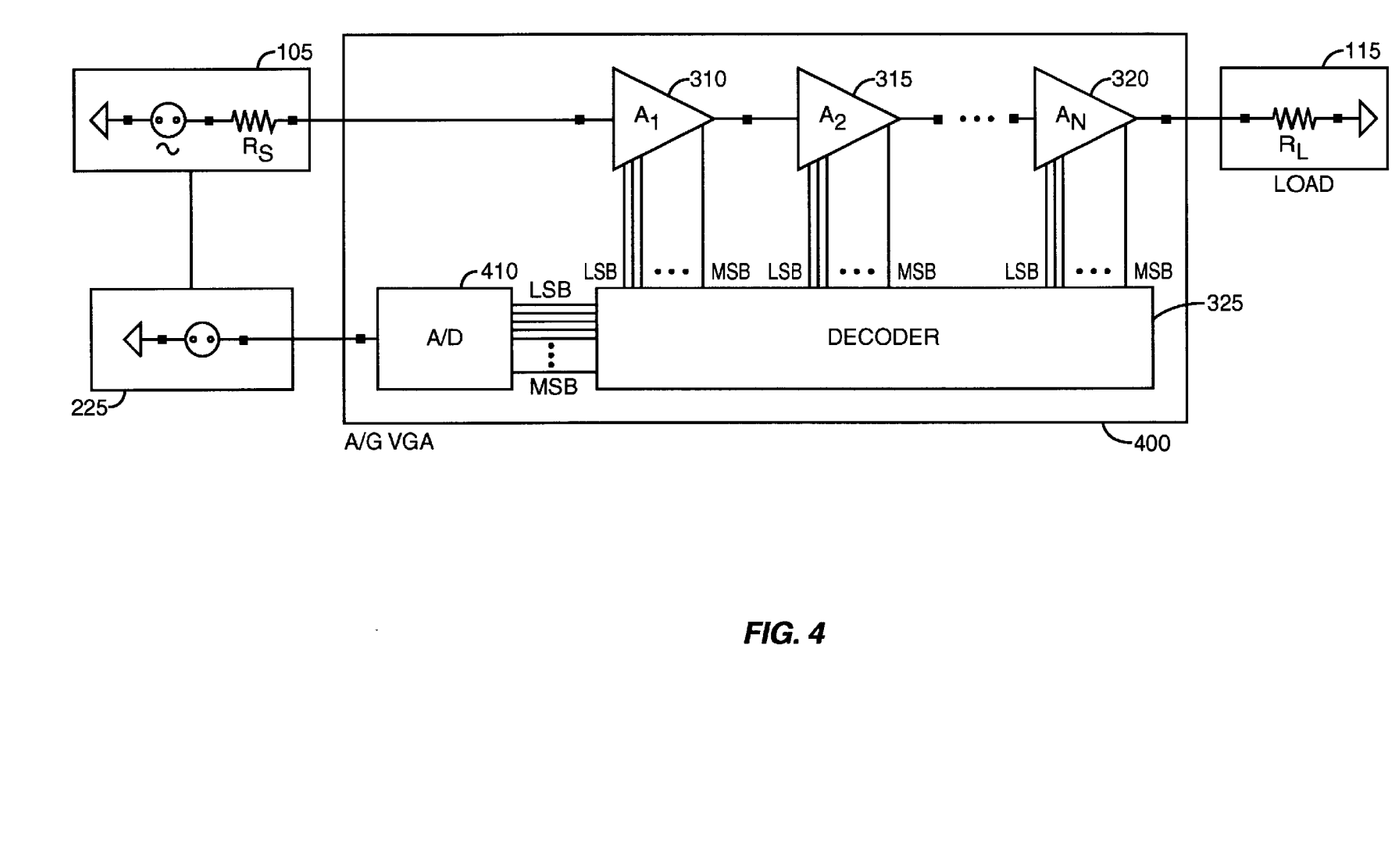
FIG. 4 is a functional block diagram of an A/D VGA having plural amplifier circuits and a decoder in accordance with an embodiment of the invention.

FIG. 4 illustrates an A/D VGA having a decoder and plural amplifying stages controlled by an analog gain control signal in accordance with an embodiment of the invention. Elements having the same reference numerals as elements in FIG. 3 are the same and will not be discussed in greater detail. The A/D VGA 400 having plural amplifying circuits further comprises an A/D converter 410 coupled between the gain control circuit 225 and the decoder 325. The A/D converter 410 is a typical A/D converter as known in the art.

In operation, a signal is received by the signal source 105. The gain control circuit 225 determines a desired gain for the received signal, and sends the desired gain to the A/D converter 410 in the form of an analog gain control signal. The A/D converter 410 then converts the analog gain control signal to a digital gain control signal. The controller present in the decoder 325 maps the gain setting represented by the digital gain control signal onto the available gain settings of the amplifier circuits 310, 315 and 320 as described in reference to FIG. 3. In this way, the received signal from the signal source 105 is amplified to the desired gain by the amplifier circuits 310, 315 and 320 and applied to the load 115.

As mentioned in relation to FIG. 2, having a digital gain controlled VGA that is controlled by an analog gain control signal is advantageous as it eliminates the large isolation requirement necessary for conventional digital gain controllable VGAs controlled using a digital gain control signal. This allows the RF signal to be undisturbed by a continuously changing gain for the digital VGA.

As an alternative, the decoder 325 may be omitted from the A/D VGA 400 while retaining the benefits gained by use of the analog gain control signal. In the case where the decoder 325 is not present, latches coupled to each amplifier circuit would be used to control the gain settings from the A/D VGA as is apparent. Each latch circuit enable would be coupled to the gain control circuit 225.

Alternatively, the gain control circuit 225 could send a single analog gain control signal to the A/D converter 410 containing the gain settings for all of the amplifier circuits in the A/D VGA 400. After processing by the A/D converter 410, and assuming a gain setting represented by e.g. 4 bits for each amplifier circuit, the digital representation of the analog gain control signal for the three amplifier circuits would require 12 bits of information. The 4 least significant bits would be coupled to the amplifier circuit 310, the next 4 significant bits would be coupled to the amplifier circuit 315, and the final 4 significant bits would be coupled to the amplifier circuit 320.

Figure 5:
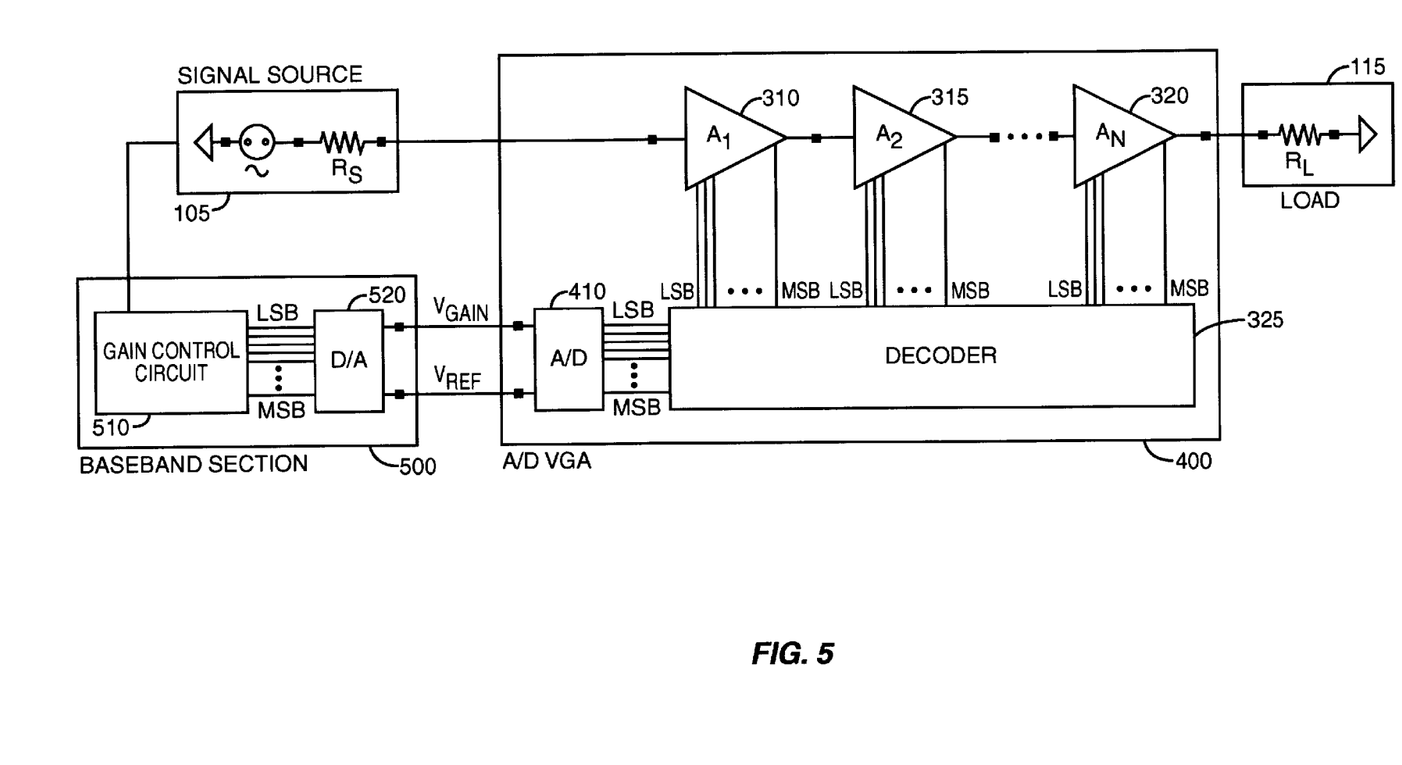
FIG. 5 is a functional block diagram of an A/D VGA having plural amplifier circuits in accordance with a further embodiment of the invention.

In another embodiment of the invention where a digital to analog (D/A) converter converts an initial digital gain control signal into an analog gain control signal, a common reference voltage is provided for the D/A converter and an A/D converter for preventing problems associated with flipping of a least significant bit (LSB) of a final digital gain control signal. FIG. 5 illustrates an A/D VGA having a decoder and plural amplifying stages controlled by an analog gain control signal in accordance with an embodiment of the invention. Elements having the same reference numerals as elements in FIG. 4 are the same and will not be discussed in greater detail. FIG. 5 shows a baseband section 500 coupled to the A/D VGA 400. The baseband section 500 comprises gain control circuit 510 coupled to the signal source 105 and to a D/A converter 520. The D/A converter 520 is coupled to the A/D converter 410. The D/A converter 520 and the A/D converter 410 utilize a common voltage reference. The importance of this common voltage reference is described in greater detail below.

In operation, the gain control circuit 510 determines a desired gain for a signal received at the signal source 105. The gain control circuit 510 then sends an initial digital gain control signal representing the desired gain to the D/A converter 520. The D/A converter 520 converts the initial digital gain control signal to an analog gain control to signal. The analog gain control signal is received by A/D converter 410 where it is converted to a final digital gain control signal, and operation continues as set out in the description for FIG. 4.

Having a common voltage reference for the D/A converter 520 and the A/D converter 410 increases the accuracy of the conversion process and decreases the possibility of the LSB of the A/D converter flipping between a value of "0" and "1". The voltage of the analog signal entering the A/D converter 410 need change by only a small amount to affect the value of the LSB of the A/D converter 410, especially where the analog voltage is close to an interval boundary for the respective bit. When the reference voltages between the D/A converter 520 and the A/D converter 410 vary slightly, the accuracy of the D/A and A/D conversion process is diminished. Further, if the conversion time of the A/D converter is much faster then the gain updates from the baseband circuit, the variance of the reference voltages could be enough to cause the LSB of the A/D converter 410 to flip. The flipping of the LSB causes amplitude modulation thereby introducing noise into the VGA in the form of spur and sideband generation. Further, flipping of the LSB continually changes the gain settings to the amplifier circuits 310, 315 and 320 as the final gain control signal entering the decoder 325 is constantly changing. This could introduce further noise into the VGA. Using a common reference voltages eliminates the slight variance of the reference voltage between the D/A converter and the A/D converter thereby increasing the accuracy of the conversion process, and decreasing the possibility of the least significant bit (LSB) of the A/D converter from flipping between a value of "0" and "1."

Figure 6:
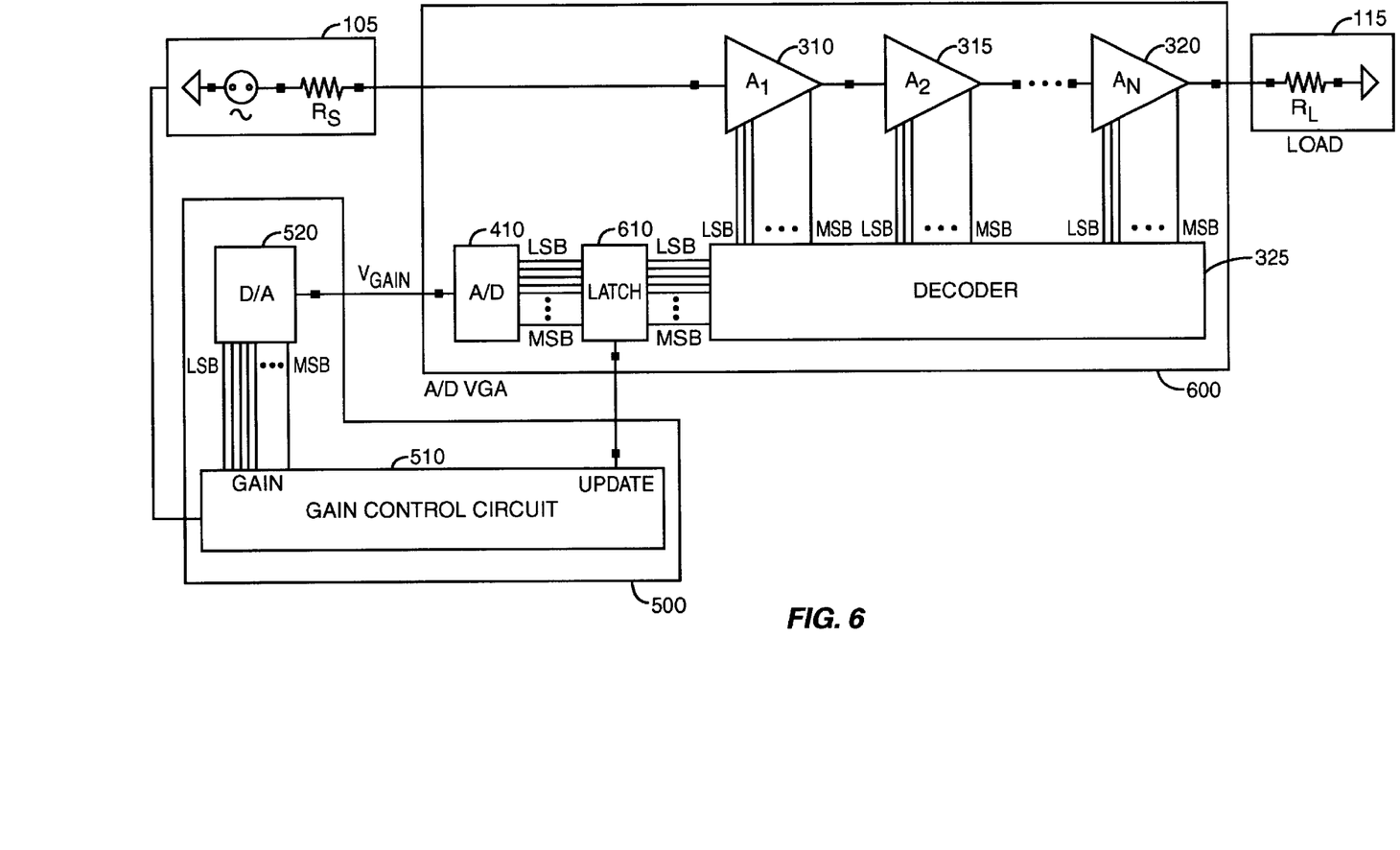
FIG. 6 is a functional block diagram of an A/D VGA having plural amplifier circuits in accordance with a further embodiment of the invention.

In an additional embodiment of the invention, an A/D VGA is provided having a latch to prevent the flipping of the LSB of the A/D converter from altering the gain setting applied by the decoder to the amplifier circuits in the A/D VGA. FIG. 6 illustrates an A/D VGA having a decoder and plural amplifying circuits controlled by an analog gain control signal in accordance with an embodiment of the invention. Elements having the same reference numerals as elements in FIG. 5 are the same and will not be discussed in greater detail. FIG. 6 shows a latch 610 coupled between the A/D converter 410 and the decoder 325, and further coupled to the gain control circuit 510.

In operation, the gain control circuit 510 determines a desired gain for a signal received at the signal source 105, and sends the desired gain to the D/A converter 520 in the form of an initial digital gain control signal. The gain control circuit 510 then sends an update signal to enable latch 610 after waiting a suitable amount of time for the initial digital gain control signal to be converted to an analog signal by the D/A converter 520 and converted back to a final digital gain control signal by the A/D converter 410. In this way, the digital gain control signal is latched to the decoder 325 by latch 610. Operation then continues as set out in the description for FIG. 4.

Where a common reference voltage for the D/A converter 520 and the A/D converter 410 is not used, or where a common reference is used and the output for the LSB of the A/D converter continues to flip, the latch 610 prevents the flipping LSB from varying the gain settings at the amplifier circuits 310, 315 and 320. This is because the gain control circuit 510 controls the latching of the digital control word to the decoder 325, thus the decoder 325 will be updated only when the desired gain for the A/D VGA 400 is changed by the gain control circuit 510.

In another embodiment of the invention, an A/D VGA is provided having a programmable decoder and noise and linearity circuit for changing the noise and linearity characteristics of the A/D VGA during operation.

Figure 7:
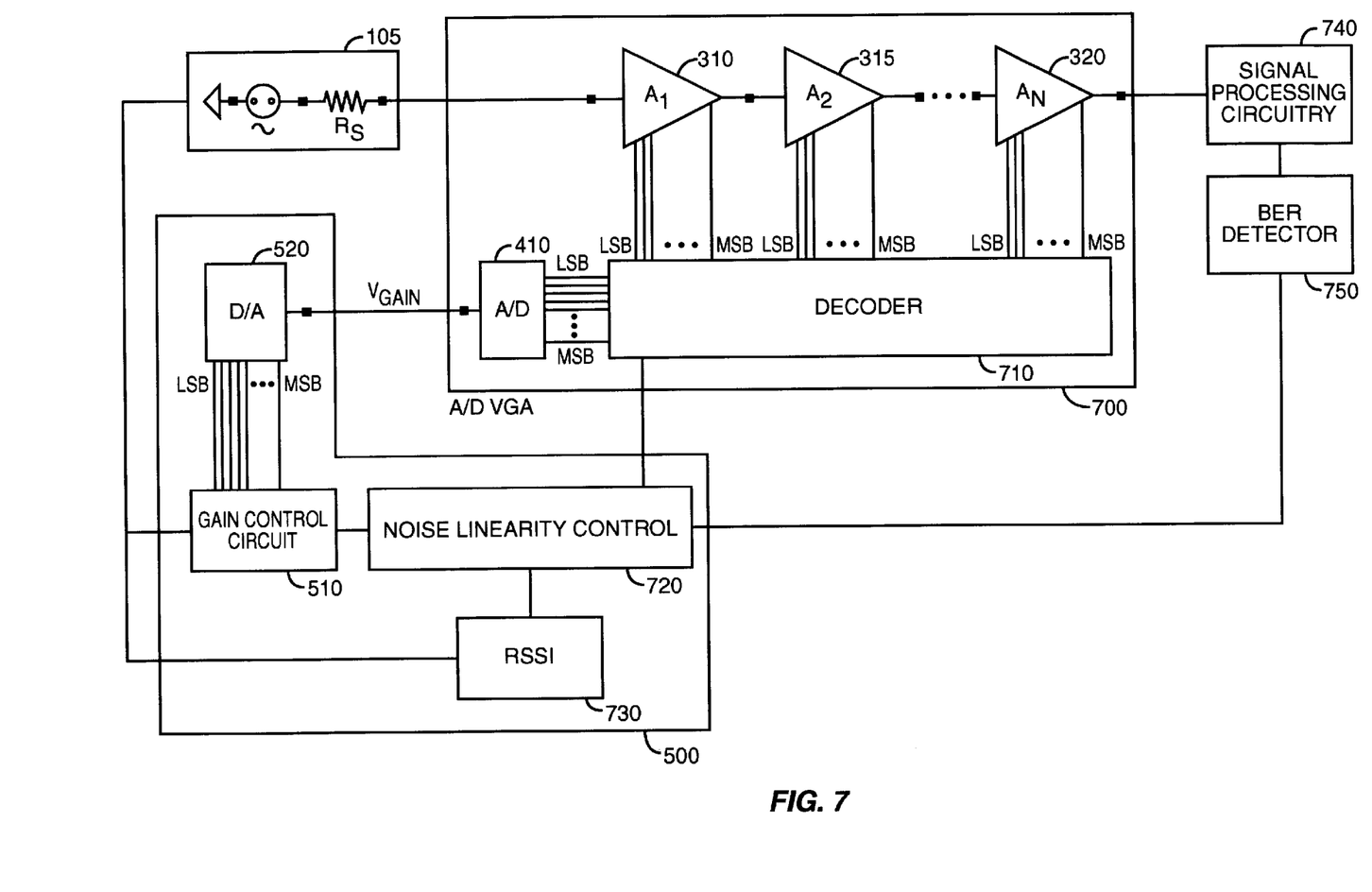
FIG. 7 is a functional block diagram of an A/D VGA including noise and linearity control circuit in accordance with an embodiment of the invention.

FIG. 7 illustrates a receiver having an A/D VGA with programmable decoder, and a noise and linearity circuit in accordance with an embodiment of the invention. Elements having the same reference numerals as elements in FIG. 5 are the same and will not be discussed in greater detail. FIG. 7 shows a noise and linearity control (NLC) circuit 720 coupled to the gain control circuit 510, and a received signal strength (RSS) indicator 730 coupled to the NLC circuit 720. The NLC circuit 720 is further coupled to a programmable decoder 710 in the A/D VGA 700. The programmable decoder 710 is coupled to the A/D converter 410, and to the amplifying circuits 310, 315 and 320. The third amplifying circuit 320 is further coupled to the signal processing circuit 740. A bit error rate (BER) detector 750 is coupled to the signal processing circuit 740 and to the NLC circuit 720.

In operation, the NLC circuit 720 determines desired noise and linearity characteristics for the A/D VGA 700. If decreased noise characteristic is desired, the NLC circuit 720 will program the gain settings in a lookup table of the decoder 710 corresponding to the final digital control signal to increase the gain setting of the amplifier circuit 310 while decreasing the gain settings for at least one of the amplifier circuits 315 and 320. If however, an increased linearity characteristic is desired, the NLC circuit 720 will program the gain settings in a lookup table of the decoder 710 corresponding to the final digital gain control signal to decrease the gain setting of the amplifier circuit 310 while increasing the gain settings of at least one of the amplifier circuits 315 and 320. In the case of either desired characteristic, the overall gain of the A/D VGA 700 will remain equal to the desired gain indicated by a final digital gain control signal. The decoder 710 will then apply the new gain settings from the lookup table to the amplifier circuits 310, 315 and 320 as described in relation to FIG. 4.

The NLC circuit 720 may determine the desired noise and linearity characteristics for the A/D VGA 700 using the RSS circuit 730 to determine the RSS of the received signal as known in the art. Where the RSS is weak, the NLC circuit 720 could program the gain settings of the decoder 710 for decreased noise characteristic, as a lower noise floor would be desired to make out the weak received signal. If the RSS is strong, the NLC circuit 720 could program the gain settings of the decoder 710 for increased linearity, as lower distortion of the received signal would then be desired.

Where the NLC circuit 720 programs the gain settings of the decoder 710 based on RSS, algorithms known in the art would be used, where the NLC circuit 720 utilizes predetermined desirable noise and linearity characteristics for given RSS measurements to calculate the gain settings for the amplifier circuits of the digital gain controlled VGA. Additionally, when calculating gain settings for a digital gain controlled VGA having more than two (2) amplifier circuits, the NLC circuit 720 could use a complex set of equations which are known in the art and tailored for a specified number of amplifier circuits to determine gain settings for each individual amplifier circuit. Alternatively where more than 2 amplifier circuits are present, as the gain setting of the first amplifier circuit has the greatest impact on noise and linearity characteristics, the NLC circuit 720 may calculate gain settings using the equations for two amplifier circuits. In this case, the gain setting calculated for the first amplifier circuit would be applied to the first amplifier circuit and the gain setting calculated for the second amplifier circuit would be distributed across the remaining amplifier circuits, where the remaining amplifier circuits are grouped together as an equivalent amplifier circuit.

Alternative to reprogramming the noise settings of the decoder, the NLC circuit 720 could cause the decoder 710 to use additional memory tables placed into the decoder 710, for example when the decoder 710 is manufactured, where the specific memory table utilized depends on the specific RSS measurement received from RSSI 730. The gain setting values in the additional memory tables could be determined experimentally for given RSS measurements or calculated using formulas known in the art for each RSS increment. Alternatively, a single memory table may be utilized where the gain settings used are indexed first by the RSS measurement, and second by the digital gain control signal value.

In an alternate embodiment, the BER detector 750 could be used in addition to the RSS circuit 730 to determine the desired noise and linearity characteristics for the A/D VGA 700. In this way, the signal processing circuit 740 performs detection and error correction decoding of the signal amplified by the A/D VGA 700. The BER detector 750 determines a BER of the processed signal. If the BER is within a BER threshold, then the NLC circuit 720 would maintain the current noise and linearity characteristics of the A/D VGA amplifier. However, if the BER detector 750 indicates a BER exceeding the BER threshold, then the NLC circuit 720 would use the RSSI circuit 730 to alter the noise and linearity characteristics of the A/D VGA 700 as mentioned above.

When determining gain settings where a BER is utilized, the NLC circuit 720 increments the noise and linearity characteristics in the desired direction (decreased noise or increased linearity), and redetect the received signal. A new BER rate is determined, wherein if the BER was adequate, the noise and linearity characteristics are maintained. However, if the BER is not adequate, the NLC circuit 720 again increments the noise and linearity characteristics in the desired direction and the process repeats until a desired BER is achieved.

Having a programmable decoder to change noise and linearity characteristics of the receiver allows improved receiver performance over a broad range of operating conditions. For example, as the receiver moves further from a transmitter causing a drop in RSS, the NLC circuit of the receiver is able to redistribute the gain settings over the amplifier circuits of the A/D VGA to decrease the noise characteristic of the receiver, thereby allowing easier detection of the weak signal. Likewise, as the receiver moves closer to the transmitter, thereby increasing RSS, the NLC circuit is able to redistribute the gain settings over the A/D VGA to increase the linearity characteristic, thereby improving the distortion of the amplified signal.

As is apparent, the NLC circuit 720 could be implemented using an A/D VGA without a decoder. In this case, the NLC circuit alters the gain settings being sent to the A/D VGA depending on the desired noise and linearity characteristics. Further, the NLC circuit 720 could be implemented independent of using an analog gain control signal to control the gain of the digital gain controlled VGA. Furthermore, although shown external to the digital VGA, the NLC circuit 720 may be located within the digital VGA without affecting the advantages gained.

Although the analog gain control signal disclosed is a voltage signal, the analog gain control signal may be in the form of a current signal, where the implementation of the A/D converter is slightly modified for accepting current signals as known in the art. Additionally, although the NLC circuit 720 is shown coupled to the gain control circuit 510, the two need not be coupled together.

Thus, a digital gain controlled VGA is provided having a built-in decoder allowing for more standardized components for radio receivers. Additionally, a digital gain controlled VGA is provided which is able to be controlled using an analog gain control signal. Use of the analog gain control signal allows the problems associated with the fast update rate required by the digital gain control word to be overcome. In addition, a digital gain controlled VGA is provided having a programmable decoder and noise and linearity circuit for changing the noise and linearity characteristics of the digital gain controlled VGA during operation.

While a particular embodiment of the present has been described and illustrated, it should be understood that the invention is not limited thereto since modifications may be made by persons skilled in the art. The present application contemplates any and all modifications that fall within the spirit and scope of the underlying invention disclosed and claimed herein.

I claim:

1. A method of controlling a digital variable gain amplifier (DVGA) of a receiver, the DVGA comprising one amplifier circuit and having an input signal, the method comprising the steps of:

receiving an analog gain control signal indicating a desired gain for the DVGA, said analog gain control signal dependent on the input signal of the DVGA, and not dependent on the output of the DVGA;

converting the analog gain control signal to a digital gain control signal; and applying the digital gain control signal to the amplifier circuit to achieve the desired gain, the amplifier circuit having a gain controlled by the digital gain control signal.

2. The method of claim 1 wherein the DVGA comprises a plurality of amplifier circuits, the method further comprising the step of:

decoding the digital gain control signal into a plurality of gain settings, where each gain setting corresponds to one of the plurality of amplifier circuits; and wherein the step of applying the digital gain control signal includes applying each gain setting to a corresponding amplifier circuit in the DVGA to achieve the desired gain.

3. The method of claim 2 wherein the step of decoding the gain signal into the plurality of gain settings includes determining the plurality of gain settings using a lookup table indexed by a gain signal value, where the plurality of gain settings correspond to the gain signal value.

4. The method of claim 3 wherein the step of decoding the gain signal into the plurality of gain settings further comprises using a lookup table indexed by a received signal strength value for decoding the gain signal into the plurality of gain settings.

5. The method of claim 1 wherein the digital gain control signal is a final digital gain control signal and an initial digital gain control signal is determined by gain control circuit, and further comprising the step of converting the initial digital gain control signal to the analog gain control signal.

6. The method of claim 5 wherein the steps of converting the initial digital gain control signal to the analog gain control signal and converting the analog gain control signal to the final digital gain control signal includes using a common reference voltage for the converters.

7. The method of claim 5 wherein the step of applying the final digital gain control signal further comprises the step of latching the final digital gain control signal, wherein the latching is controlled by the gain control circuit.

8. The method of claim 1 wherein the DVGA comprises a plurality of amplifier circuits, and further comprising the step of controlling the noise and linearity characteristics of the DVGA by changing the distribution of gain across the plurality of amplifier circuits.

9. A method of controlling a digital variable gain amplifier (DVGA), the DVGA having a plurality of amplifier circuits where the gain of each amplifier circuit is controlled by a gain setting, the method comprising:
   determining the desired noise and linearity characteristics of the DVGA for a time period;
   if a decreased noise characteristic is desired in the DVGA for the time period, a controller circuit increasing the gain setting of a first amplifier circuit of the DVGA while decreasing gain settings for at least one of a remainder of the plurality of amplifier circuits in the DVGA; and
   if an increased linearity characteristic is desired in the DVGA for the time period, the controller circuit decreasing the gain setting of the first amplifier circuit of the DVGA while increasing the gain settings for at least one of the remainder of the plurality of amplifier circuits in the DVGA.

10. The method of claim 9 wherein the step of determining the desired noise and linearity characteristics includes
   determining a received signal strength (RSS) of a received signal wherein
   if the RSS does not exceed an RSS threshold, the desired noise and linearity characteristic is set for decreased noise; and
   if the RSS exceeds the RSS threshold, the desired noise and linearity characteristic is set for increased linearity.

11. The method of claim 9 further comprising the steps of receiving an analog gain control signal indicating a desired gain for the DVGA and converting the analog gain control signal to a digital gain control signal, wherein the digital gain control signal is used to determine gain settings for the DVGA.

12. The method of claim 9 further comprising the steps of receiving a gain control signal and decoding the gain control signal into a plurality of gain settings, where each gain setting corresponds to one of the plurality of amplifier circuits.

13. A digital gain controlled variable gain amplifier (DVGA) comprising:
   an amplifier circuit having a gain controlled by a digital gain control signal, for applying a desired gain to a received signal from a signal source, and applying the amplified received signal to a load;
   an analog to digital (A/D) converter coupled to the amplifier circuit for receiving an analog gain control signal, the analog gain control signal dependent on the received signal from a signal source and not dependent on the DVGA output, and converting the analog gain control signal to the digital gain control signal, and for applying the digital gain control signal to the amplifier circuit.

14. The DVGA of claim 13 wherein the DVGA comprises a plurality of amplifier circuits, and further comprising a decoder connected between the A/D converter and the plurality of amplifier circuits for decoding the digital gain control signal into a plurality of gain settings, where each gain setting corresponds to one of the plurality of amplifier circuits.

15. The DVGA of claim 14 further comprising noise and linearity control circuit coupled to the decoder for controlling noise and linearity characteristics of the DVGA by changing the distribution of gain across the plurality of amplifier circuits.

16. The DVGA of claim 13 wherein the digital gain control signal is a final digital gain control signal and further comprising a digital to analog (D/A) converter external to the DVGA and coupled to the A/D converter for receiving an initial digital gain control signal from a gain control circuit and converting the initial digital gain control signal to the analog gain control signal.

17. The DVGA of claim 16 wherein a common reference voltage is used for the D/A converter and the A/D converter.

18. The DVGA of claim 17 further comprising a latch coupled to the A/D converter for latching the final digital gain control signal.

19. The DVGA of claim 18 wherein the latch is controlled by the gain control circuit.

20. The DVGA of claim 13 wherein the DVGA comprises a plurality of amplifier circuits and further comprising NLC circuit coupled to the DVGA for controlling noise and linearity characteristics of the DVGA by changing the distribution of gain across the plurality of amplifier circuits.

21. A digital gain controlled variable gain amplifier (DVGA) with improved noise and linearity characteristics, the DVGA comprising:
   a plurality of amplifier circuits, each amplifier circuit having a gain controlled by a digital gain control signal, for applying a desired gain to a received signal from a signal source, and applying the amplified received signal to a load;
   a noise and linearity control (NLC) circuit comprising a controller coupled to the plurality of amplifier circuits for determining a desired noise and linearity characteristic for the DVGA, and including
   means for increasing a gain setting of a first amplifier circuit of the DVGA while decreasing gain settings for at least one of a remainder of the plurality of amplifier circuits in the DVGA if a decreased noise characteristic is desired in the DVGA, and
   means for decreasing the gain setting of the first amplifier circuit of the DVGA while increasing the gain settings for at least one of the remainder of the plurality of amplifier circuits in the DVGA if an increased linearity characteristic is desired in the DVGA.

22. The DVGA of claim 21, further comprising a decoder for decoding a gain control signal into a plurality of gain settings for the plurality of amplifier circuits by using a lookup table indexed by a gain control value, and applying the gain settings to each of the plurality of amplifier circuits to achieve a desired gain, and the controller decreases the noise characteristic and increases the linearity characteristic by changing the values of the gain settings in the lookup table.

23. The DVGA of claim 22 further comprising an analog to digital converter coupled to the plurality of amplifiers for converting an analog gain control signal to a digital gain control signal, wherein the gain settings are determined from the digital gain control signal.

24. The DVGA of claim 21 further comprising a received signal strength indicator (RSSI) coupled to the NLC circuit wherein
   if the controller determines that a received signal strength (RSS) does not exceed an RSS threshold, the controller sets the noise and linearity characteristics of the DVGA for decreased noise; and
   if the controller determines that the RSS exceeds the RSS threshold, the controller sets the noise and linearity characteristics of the DVGA for increased linearity.

25. The DVGA of claim 24 further comprising a bit error rate detector coupled to the NLC circuit for determining a bit error rate (BER) for a detected signal, wherein if the BER does not exceed a BER threshold, the controller maintains the determined noise and linearity characteristics, and if the BER exceeds the BER threshold, the controller
sets the desired noise and linearity characteristics of the DVGA for decreased noise if the RSS does not exceed the RSS threshold, and
sets the noise and linearity characteristics of the DVGA for increased linearity if the RSS exceeds the RSS threshold.

26. The DVGA of claim 21 further comprising a lookup table coupled to the NLC circuit, the lookup table being indexed by a digital gain control signal value and comprising gain settings for the plurality of amplifier circuits.

27. The DVGA of claim 26 wherein the means for increasing and means for decreasing the gain settings includes the NLC circuit changing the gain settings in the lookup table.

28. The DVGA of claim 26 wherein the means for increasing and means for decreasing the gain settings includes the NLC circuit accessing a specific location of the lookup table wherein gain settings are provided for specified noise and linearity characteristics.

29. A digital gain controlled variable gain amplifier (DVGA) integrated circuit comprising:
at least one amplifier circuit, each amplifier circuit having a gain controlled by a digital gain control signal, for applying a desired gain to a received signal from a signal source, and applying the amplified received signal to a load;
a decoder coupled to the at least one amplifier circuit comprising
a controller for determining a desired gain for the DVGA; and
a memory coupled to the controller and having a memory table indexed by a gain control value, wherein each gain control value has corresponding gain settings for the at least one amplifier circuit so as to allow the DVGA to achieve the desired gain;
wherein the controller determines the gain control value from a received gain control signal and applies the gain settings corresponding to the gain control value from the memory table to the at least one amplifier circuit to achieve the desired gain.

30. The DVGA integrated circuit of claim 29 wherein the gain control signal is an analog gain control signal and the DVGA further comprises an analog to digital (A/D) converter coupled to the decoder wherein
the A/D converter converts the analog gain control signal to a digital gain control signal, and the controller uses the digital gain control signal to determine the gain control value.

31. The DVGA integrated circuit of claim 29 wherein noise and linearity control circuit is coupled to the decoder wherein the controller, responsive to the noise and linearity control circuit, changes the gain settings in the memory table to control noise and linearity characteristics of the DVGA.

* * * * *